(12) United States Patent
Jermann et al.

(10) Patent No.: US 7,126,265 B2
(45) Date of Patent: Oct. 24, 2006

(54) CONVERSION LED HAVING A PHOSPHOR COMPONENT BASED ON AN AGGLOMERATION OF PHOSPHOR PARTICLES AND PORES

(75) Inventors: Frank Jermann, München (DE); Martin Zachau, Geltendorf (DE)

(73) Assignee: Patent-Treuhand-Gesellschaft fuer Elektrische Gluehlampen mbH, Munich (DE)

( * ) Notice: Subject to any disclaimer, the term of this patent is extended or adjusted under 35 U.S.C. 154(b) by 149 days.

(21) Appl. No.: 10/851,226

(22) Filed: May 24, 2004

(65) Prior Publication Data

US 2005/0012446 A1    Jan. 20, 2005

(30) Foreign Application Priority Data

May 28, 2003    (DE) ............................ 203 08 495 U

(51) Int. Cl.
*H01L 51/50*    (2006.01)
*H01J 1/62*    (2006.01)

(52) U.S. Cl. ...................... 313/485; 313/486; 313/512; 257/98

(58) Field of Classification Search ......... 313/483–487
See application file for complete search history.

(56) References Cited

U.S. PATENT DOCUMENTS 5,851,428 A * 12/1998 Matsuda et al. ...... 252/301.4 R
6,712,993 B1 * 3/2004 Kijima et al. ......... 252/301.4 R
6,791,259 B1 * 9/2004 Stokes et al. ................ 313/503
2003/0030368 A1 * 2/2003 Ellens et al. ................. 313/503
2005/0035332 A1 * 2/2005 Nagashima et al. ... 252/301.36

FOREIGN PATENT DOCUMENTS

| DE | 10316769 A1 | * | 10/2004 |
| EP | 1167489 A2 | * | 1/2002 |
| EP | 1278250 A2 | * | 1/2003 |
| JP | 2002038150 A | * | 2/2002 |
| JP | 2004071908 A | * | 3/2004 |
| JP | 2005041942 A | * | 2/2005 |
| WO | WO 03/102113 | | 12/2003 |

OTHER PUBLICATIONS

I. Matsubara et al., Preparation of Cr-doped $Y_3Al_5O_{12}$ Phosphors by Heterogeneous Precipitation Methods and Their Luminescent Properties, Materials Research Bulletin 35 (2000) 217-224.

* cited by examiner

*Primary Examiner*—Mariceli Santiago
(74) *Attorney, Agent, or Firm*—Robert F. Clark

(57) ABSTRACT

The LED has phosphor particles (2) with a mean phosphor particle size $d_{50}$ selected from the range of from 0.1 μm, inclusive, to 1.5 μm, inclusive, in particular the phosphor particles having primary particles (4) with a mean particle size (5) selected from the range of from 0.1 μm, inclusive, to 1.0 μm, inclusive. The primary particles, which comprise, for example, an yttrium aluminum garnet ($Y_3Al_5O_{12}$) doped with cerium, are agglomerated to form the phosphor particles.

15 Claims, 5 Drawing Sheets

CONVERSION LED HAVING A PHOSPHOR COMPONENT BASED ON AN AGGLOMERATION OF PHOSPHOR PARTICLES AND PORES

TECHNICAL FIELD

The invention relates to an LED of high efficiency that is designed as a conversion LED.

BACKGROUND ART

A phosphor powder of small particle size, and a process for producing it are known from I. Matsubara et al., Materials Research Bulletin 35 (2000), pages 217–224. The phosphor particles have a mean phosphor particle size of at least 1 μm. The phosphor particles consist of an yttrium aluminum garnet ($Y_3Al_5O_{12}$) doped with chromium. Chromium is contained, for example, at 0.5 mol %. In this case, chromium constitutes an optically active component of the garnet. Chromium absorbs exciting light and emits emission light (luminescence) after excitement. The chromium contained in the garnet can also be excited to luminescence with the aid of electrons. Thus, the known phosphor powder is used, for example, in a luminescent screen (phosphor body) of a cathode ray tube. WO 03/102113 discloses a phosphor powder with a particle size of between 0.1 and 5 μm, which is used for a conversion LED.

The production of the known phosphor is performed with the aid of a so-called heterogeneous precipitation. For this purpose, aluminum sulfate ($Al_2(SO_4)_3$) and urea are dissolved in distilled water. The solution is stirred continuously at a temperature of 80–90° C. for a duration of two hours. The precipitate of aluminum hydroxide ($Al(OH)_3$) is formed in the process. The precipitate obtained is washed with distilled water and isopropanol and dried for one day at a temperature of 120° C. The aluminum hydroxide is suspended in distilled water. In order to avoid an agglomeration of the aluminum hydroxide powder, energetic stirring is carried out and urea is added. Stoichiometric quantities of yttrium sulfate ($Y_2(SO_4)_3$) and chromium sulfate ($Cr_2(SO_4)_3$) are likewise dissolved in distilled water. Thereafter, the suspensions and the solution are mixed with one another and heated for an hour to 80–90° C. The precipitate thereby obtained is washed with distilled water and isopropanol, centrifuged and dried overnight at 120° C. Finally, the powder obtained is calcined for two hours at 900° C.–1700° C. in the presence of air. A chromium-doped yttrium aluminum garnet is obtained that has a relatively high luminescent efficiency.

Since the phosphor powder produced using this process consists of phosphor particles that in each case have a layer that is a few tenths of a μm thick and does not contribute to the luminescence (dead layer), the phosphor particles must have a mean phosphor particle size of at least 1 μm for the high luminescent efficiency. A typical diameter of the phosphor particles is 1 μm on average. This means, however, that production parameters of the process must be set very accurately so that the resulting phosphor powder has the high luminescent efficiency.

DISCLOSURE OF THE INVENTION

It is an object of the invention to provide a high-efficiency conversion LED that uses phosphor powder for the conversion of the primary radiation. It is a further object of the invention tp provide a conversion LED, having a chip that emits primary radiation with a peak wavelength of from 300 to 550 nm, and having at least one phosphor that is present as a powder and absorbs at least a portion of the primary radiation and emits at another wavelength than the secondary radiation.

In order to achieve these objects, a phosphor powder is specified that has phosphor particles with a mean phosphor particle size $d_{50}$ selected from the range of from 0.1 μm, inclusive, to 1.5 μm, inclusive. The phosphor powder is preferably characterized, in that the phosphor particles have primary particles with a mean primary particle size selected from the range of from 0.1 μm, inclusive, to 1.0 μm, inclusive. In particular, as regards the mean phosphor particle size a preferred value for the lower limit is 0.2 μm, with particular preference 0.5 μm.

Moreover, a phosphor body is specified that has such a phosphor powder for the conversion of exciting light into emission light. The emission light, which is designated as luminescence, can comprise both fluorescence and phosphorescence. The phosphor body can consist in this case only of the phosphor powder. It is also conceivable for the phosphor powder to be located in a matrix of the phosphor body that is transparent to the exciting light and emission light. Likewise, the phosphor powder can be applied as a layer on the phosphor body. The phosphor body is, for example, an LED converter. LED stands for light-emitting diode.

It has emerged that a phosphor powder with a very high luminescent efficiency is obtained when the phosphor particles are formed from small particles with $d_{50}$ in the range 0.1 μm to 1.5 μm, in particular to 1.0 μm, in particular from primary particles contributing to the luminescence. The primary particles are separated in one embodiment, while in another embodiment they are permanently connected to one another in the sense of an aggregate (secondary particles). In some circumstances, both forms can yield agglomerates, but these are not understood here as actual phosphor particles in the sense of the above definition.

The phosphor particles preferably have a substantially spherical shape, in particular that of a ball. What is meant by this is that they do not have pronounced cubic or needle-shaped structure, but can well have pores.

The primary particles contribute to the luminescent efficiency of the phosphor powder in accordance with their composition. The primary particles can in this case have compositions that deviate from one another.

In particular, the primary particles can now form substantially a single phase. This means that the primary particles uniformly have a particularly desired composition with the same (photo)physical properties.

For example, in the binary system of aluminum oxide/yttrium oxide ($Al_2O_3$—$Y_2O_3$), in addition to the photophysically active yttrium aluminum garnet phase, further phases which do not contribute to the luminescent efficiency and are actually not desired could also be present. The compositions $YAlO_3$ or $Al_2Y_4O_9$, for example, have such phases. The primary particles preferably have the structure of a garnet. The garnet has, in particular, a composition of $A_3B_5O_{12}$, A and B being trivalent metals. The garnet is preferably an yttrium aluminum garnet having the composition of $Y_3Al_5O_{12}$.

Such a garnet acquires its phosphor property by virtue of the fact that the garnet is doped. In particular, the primary particles therefore have at least one doping with a rare earth metal. The rare earth metal is selected, in particular, from the group of cerium and/or gadolinium (Gd) and/or lanthanum (La) and/or terbium (Tb) and/or praseodymium (Pr) and/or europium (Eu). Pr and Eu are suitable, in particular, also for codoping, for example together with Ce. Further dopings, for example a transition metal doping with chromium (Cr), or mixtures of dopings are likewise conceivable.

In a further particular refinement, the phosphor particles have pores with a mean pore size selected from the range of from 0.1 μm, inclusive, to 1.0 μm, inclusive. In particular, the mean pore size is approximately 0.5 μm. This results, in particular, in a phosphor particle density of the phosphor particles that is selected from the range of from 40%, inclusive, to 70%, inclusive, of a theoretical density.

A production process is described below. For the production process, the precursor is selected, in particular, from the group of metal hydroxide and/or metal oxide. Aluminum hydroxide and yttrium oxide are used, for example, in the case of the yttrium/aluminum garnet.

In particular, a chemical precipitation of the precursor from a metal salt solution of the metal salt is carried out in order to provide the precursor.

The metal salt is preferably selected from the group of metal halide or metal sulfate. The metal halide is a metal chloride, for example. Use is preferably made of an acid metal salt solution and, for the precipitation, a basic precipitating reagent. In order to produce the fine primary particles, the basic precipitating reagent is, in particular, added in drops to the acid metal salt solution, or the acid metal salt solution is added in drops to the basic precipitating reagent. A sulfuric-acid metal salt solution, in particular, is used as acid metal salt solution. Aqua ammonia, in particular, is used in this case as basic precipitating reagent. This is understood as a solution in which ammonia is dissolved directly in the solvent, for example water. However, it is also conceivable for a precursor of the ammonia to be dissolved in the solvent with the release of ammonia. The precursor is urea, for example. Ammonia is released when the urea is heated.

In a further refinement, a maturation of the precursor is carried out in order to provide the precursor after the precursor has been precipitated. During the maturation, intensified crystal growth of the primary particles occurs, or there is an intensified aggregation of the primary particles to form the phosphor particles.

The maturation takes place, in particular, at a pH value of from 5.5, inclusive, to 6.5, inclusive. The maturation is carried out, in particular, at a maturation temperature that is selected from the range of from 20° C. inclusive, to 90° C., inclusive.

A calcination is carried out, in particular, in order to produce the primary particles and/or to form the phosphor particles. Intensified aggregation can take place between the primary particles during the calcination. The calcination is preferably carried out at a calcination temperature that is selected from the range of from 1200° C., inclusive, to 1700° C., inclusive. In particular, the calcination temperature is up to 1500° C.

Further processing steps can be appended to the calcination. For example, the (raw) phosphor particles obtained are additionally milled, for example.

BRIEF DESCRIPTION OF THE DRAWINGS

The invention is explained below in more detail with the aid of an exemplary embodiment and the associated figures. The figures are schematic and do not constitute illustrations true to scale.

BEST MODE FOR CARRYING OUT THE INVENTION

Figure 1:
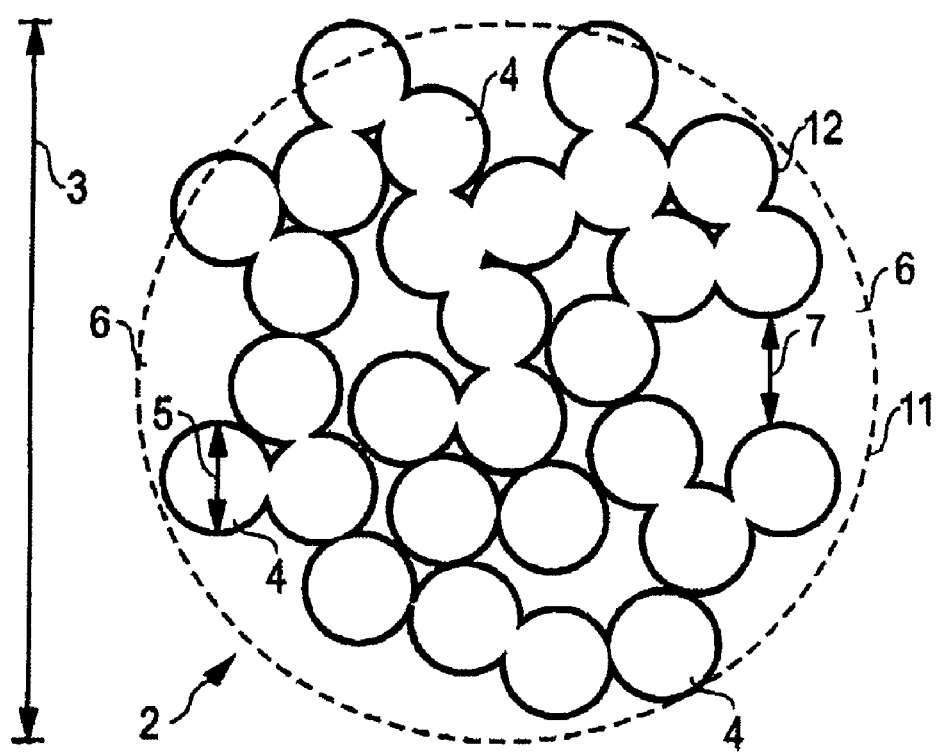
FIG. 1 shows a schematic of a phosphor particle that consists of a multiplicity of primary particles.
Figure 2A:
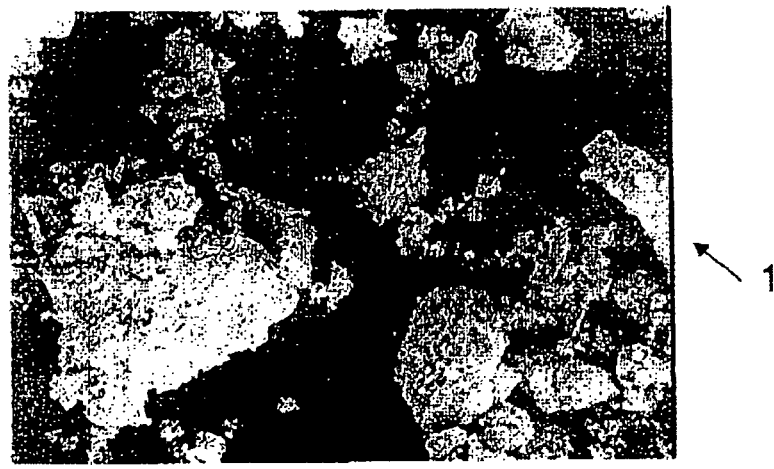
FIGS. 2a to 2c respectively show an REM image of a phosphor powder.
Figure 2B:
Figure 2C:
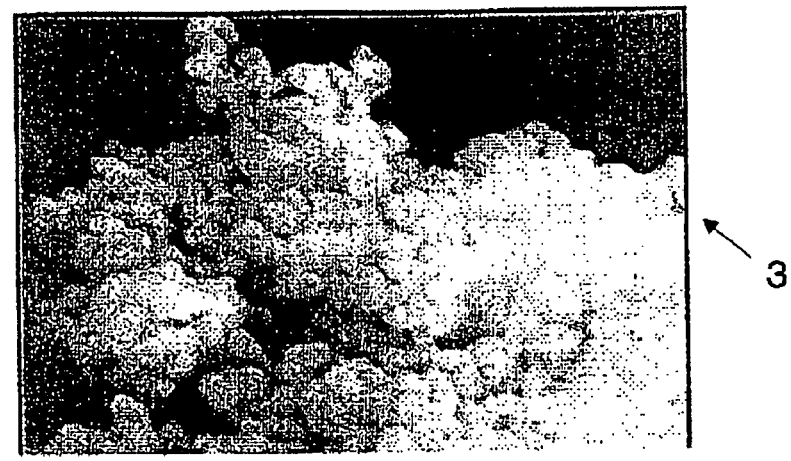

The phosphor powder 1 consists of a multiplicity of phosphor particles 2 (FIGS. 1 and 2). The phosphor particles 2 have a spherical, or at least substantially spherical shape 11. In particular, an arbitrarily oriented diameter deviates from the maximum diameter by no more than 30%, see FIG. 1. The mean phosphor particle diameter 3 of the phosphor particles is approximately 1.3 μm. The individual phosphor particles 2 respectively consist of an aggregate or else agglomerate 12 of a multiplicity of primary particles 4. The primary particles in this case have mean primary particle diameters 5 of approximately 0.5 μm. The phosphor particles 2 substantially consist only of the primary particles 4. In addition, the phosphor particles 2 have pores 6 with a mean pore size 7 of approximately 0.5 μm. The pores 6 are open.

The said particle diameters are understood in the case of the primary particles or, rather, of smaller diameters as equivalent diameters by means of particle images acquired optically or by electron microscope (for example REM), and in the case of the phosphor particles or, rather, of larger diameters here understood as equivalent diameters from laser diffraction measurements. It can be assumed to a good approximation that the two different methods for detecting equivalent diameters yield similar to identical results for one and the same sample when the powder samples are prepared for measurement in an optimal fashion.

The primary particles 4 consist of an yttrium aluminum garnet with the composition of $Y_3Al_5O_{12}$. The primary particles 4 are doped with the rare earth metal Cer. Cer is contained at 0.5 mol %. The primary particles 4 form a single phase with the said composition.

Figure 4:
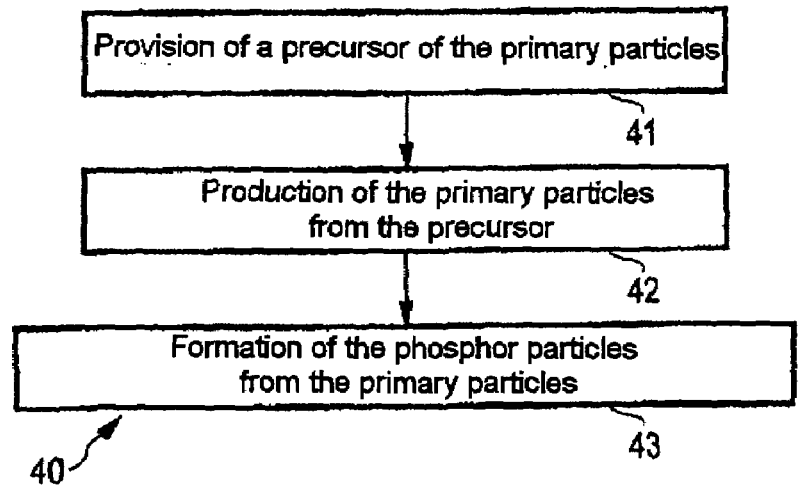
FIG. 4 shows a process for producing the phosphor powder.
Figure 5:
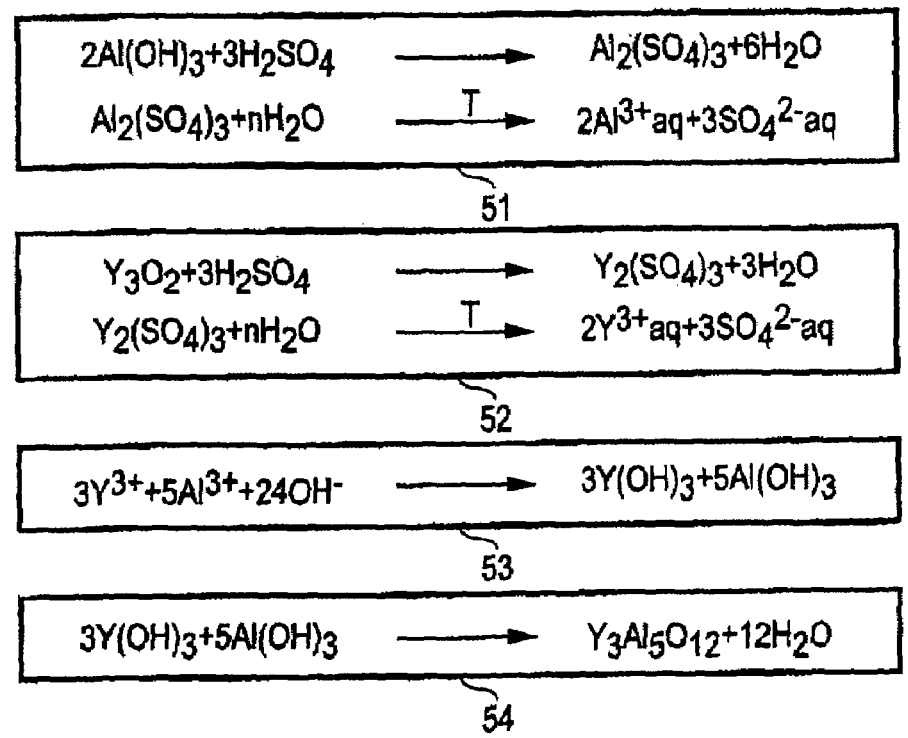
FIG. 5 shows the reaction equations on which the process is based.

In accordance with the process for producing the phosphor powder 1 (FIG. 4, 40), a precursor of the primary particles is firstly prepared (FIG. 4, 41). The precursor comprises a powder mixture of aluminum hydroxide (Al(OH)$_3$) and yttrium hydroxide (Y(OH)$_3$). For this purpose, aluminum hydroxide and yttrium oxide are dissolved separately from one another in concentrated sulfuric acid (FIG. 5, 51 and 52). The temperature is raised in order to accelerate the process of solution. The two sulfuric-acid metal salt solutions obtained are filtered. The concentration of aluminum or yttrium is determined in each case. The solutions are then mixed with one another in accordance with the required stoichiometric measurements. Thereafter, the corresponding hydroxides are precipitated with the aid of a basic aqua ammonia (FIG. 5, 53). Aqua ammonia consists of ammonia (NH$_3$) dissolved in distilled water. The aqua ammonia is added in drops to the sulfuric-acid solution of the metal salts for the purpose of precipitation. The precipitate obtained in this case is washed with distilled water, which is cold at 10° C. Since a specific quantity of aluminum is washed out by the water, it is to be ensured during mixing of the sulfuric-acid metal salt solutions that aluminum is fed in excess. The precipitate is filtered and dried for ten hours at 150° C. Moreover, the precipitate is calcined in the presence of forming gas of which 95% by volume is nitrogen ($N_2$) and 5% by volume is hydrogen ($H_2$) (FIG. 5, 54). The calcination is performed at 1200° C. for a duration of approximately two hours. During the calcination, the primary particles are formed from the precursor (FIG. 4, 42). At the same time, the phosphor particles of the phosphor powder are formed by agglomeration of the primary particles (FIG. 4, 43). A phosphor powder with a high luminescent efficiency is obtained.

Figure 3A:
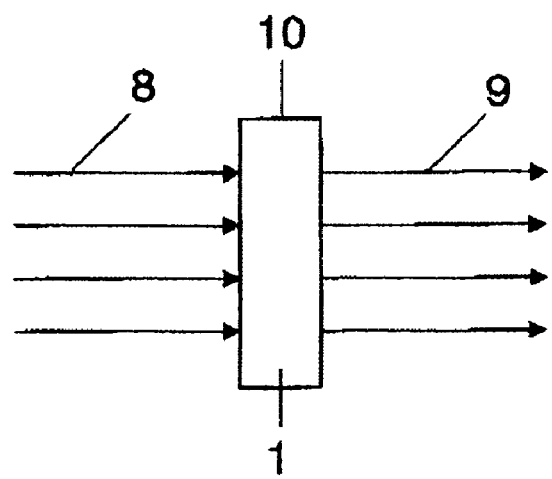
FIG. 3 shows a phosphor body with the phosphor powder (FIG. 3a), and, specifically, an LED (FIG. 3b) with such an arrangement.

The phosphor powder 1 is used in a phosphor body 10 (FIG. 3a in the schematic illustration). The phosphor body 10 is principally a phosphor-containing device such as a conversion LED, in particular. Such LEDs are also known by the term LUKOLED. Exciting light 8, that is to say light (or else short wave radiation) emitted primarily by a chip is converted in part or completely into emission light (luminescence) 9 with the aid of the phosphor powder 1. This luminescence is frequently also termed secondary emission.

Figure 3B:
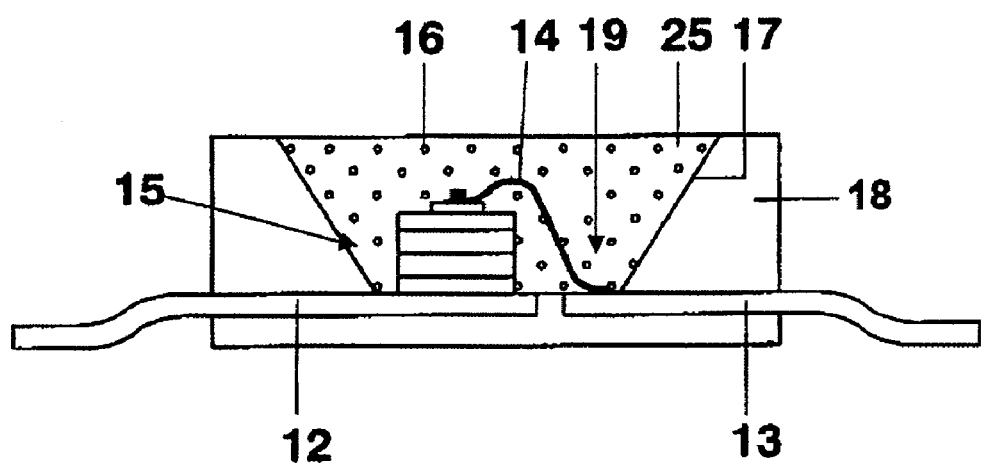

A concrete example of a phosphor body is the use of the phosphor powder in a white, or else color LED together with an InGaN chip. The exemplary design of such a light source is shown explicitly in FIG. 3b. The light source is a semiconductor component (chip 1) of InGaN type with a peak emission wavelength of 460 nm (blue) and having a first and second electric connection 12, 13 that is embedded in an opaque base housing 18 in the region of a recess 19. One of the connections 13 is connected to the chip 15 via a bonding wire 14. The recess has a wall 17 that serves as reflector for the blue primary radiation of the chip 15. The recess 19 is filed with a sealing compound 25 that contains as main constituents a silicone casting resin (or else epoxy casting resin) (80 to 90% by weight) and phosphor pigments 16 (less than 15% by weight). There are further small proportions of methyl ether and aerosol, inter alia. The phosphor pigments are yellow-emitting YAG:Ce in accordance with the present invention, or a mixture of two (or else more) pigments whose emission is green and red. For example, a suitable green-emitting phosphor is a Ce-doped yttrium garnet that also contains in addition to Al proportions of Ga and/or Sc at the lattice site of the aluminum. An example of a red-emitting phosphor is an Eu-containing nitride. In both cases, the secondary light of the phosphor mixes with the primary light of the chip to form white. A color LED is obtained, for example, by using a YAG:Eu as phosphor for excitation by means of a UV-emitting chip.

It has emerged, surprisingly, that particular advantages can be achieved for conversion LEDs by means of particularly careful selection of the particle size $d_{50}$ of the phosphor. A high efficiency may be observed, in particular, given a selection of the mean particle size $d_{50}$ in the range of between 0.2 and 1.0 μm. A high degree of scattering is consciously accepted in this case in a departure from previous notions, because the absorption:scattering ratio is also simultaneously increased. The ideal case is the selection of $d_{50}$ in the vicinity of the particle size with maximum scattering, referred to the primary incident radiation. Deviations of up to 20% have proved to be also effective in practice. Deviations of up to 50% frequently yield results that are still satisfactory. It is fundamentally possible thereby to achieve an LED with a high level of absorption of the phosphor located in front of the primary radiation source.

Figure 6A:
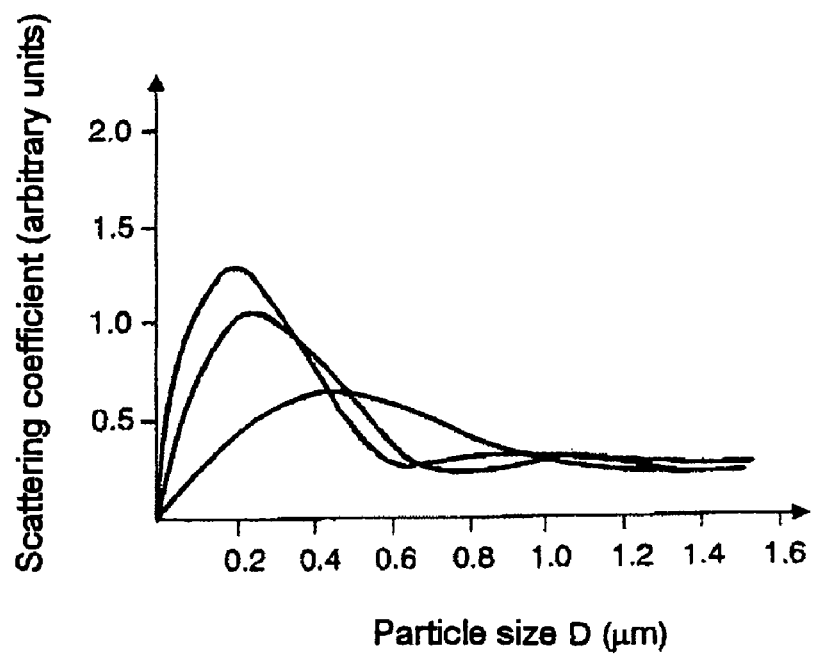
FIG. 6 shows the scattering and absorption of small phosphor particles as a function of particle size.

FIG. 6a, in which the scattering coefficient (in arbitrary units and referred to the volumetric concentration) is plotted against the particle size in μm, shows by way of example for three phosphors that in many phosphors the scattering increases toward smaller particle diameters D of less than 1 μm. It can typically be increased by up to a factor of 5. This permits a substantially improved homogenization of the radiation output overall, which is of particular importance chiefly for mixed-light LEDs. What is meant here is that the primary radiation of the LED is not completely converted, but a certain residue thereof still itself makes a direct contribution to the radiation effectively used. A concrete example is a primarily blue-emitting chip whose radiation is mixed with a yellow-emitting phosphor. However, the two types of radiation come from different space regions. In order to blur color fringes associated therewith, it has even been necessary to date for scattering filling particles also to be added to the casting compound, which is firstly expensive, and secondly rather reduces the efficiency. In particular, this design is important when more than one phosphor is used for partial conversion, that is to say in the case, for example, of a system with blue primary radiation, which is converted in part by a green phosphor and in part by a red one, for the purpose of a white LED based on the RGB mixing principle. Typical maximum scatterings occur at D=0.2 to 0.5 μm. In this case, the scattering intensity is typically increased by a factor of 2 to 5 by comparison with the value at D=1.5 μm. There is scarcely any more change in the scattering intensity toward high diameters (D=2 to 5 μm).

Figure 6B:
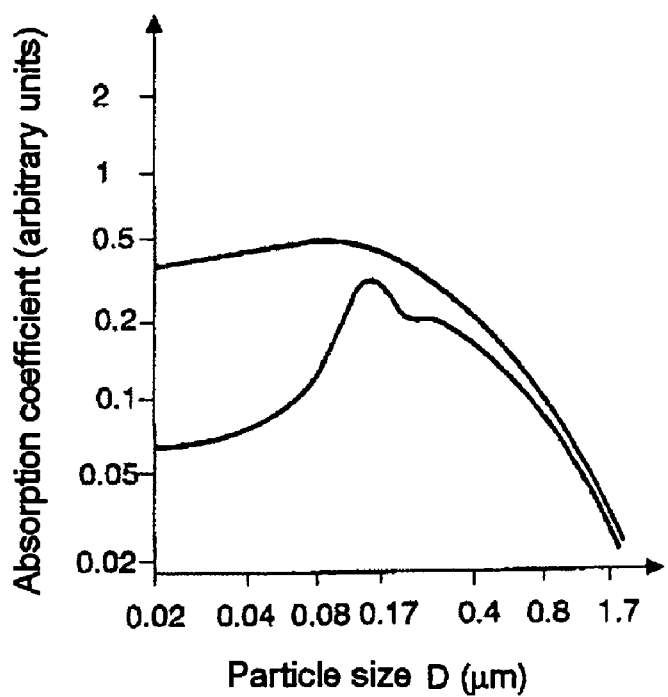

FIG. 6b, in which the absorption coefficient (in arbitrary units and referred to the volumetric concentration) is plotted against the particle size in Pm, shows by way of example that the absorption increases toward smaller particle diameters D, and traverses a more or less strongly expressed maximum at approximately D=0.06 to 0.3 μm. Here, the absorption is in part more than 5 times greater than at approximately D=2 μm and at least twice as large as at D=1 μm.

Overall, the absorption:scattering ratio typically rises continuously toward smaller particle diameters D of from 2 μm down to 0.2 μm. This means an overall reduction in the scattering losses and an increased efficiency. Although an increased scattering is accepted in some circumstances in this case, a high-efficiency LED with homogeneous emission behavior does result. The higher scattering leads to a better and more homogeneous correspondence between the behavior of blue and yellow radiation. The high absorption leads to higher efficiency.

It is thereby possible to achieve good results for a selection of the mean diameter $d_{50}$ in the vicinity of the optimum diameter D, with a range from 0.1 to 1.5 μm.

The dispersion index DI of the particle size distribution can preferably be so narrowly dimensioned that it does not impair the effect achieved, or does so only slightly. A reference point is provided by DI≦0.5.

What is claimed is:

1. A conversion LED, having a chip that emits primary radiation with a peak wavelength of from 300 to 550 nm, and having at least one phosphor that is present as a powder and absorbs at least a portion of the primary radiation and emits at another wavelength than the secondary radiation, wherein the mean particle size $d_{50}$ of the phosphor is in the range of 0.1 μm to 1.5 μm and the phosphor particles have pores with a mean pore size in the range of from 0.1 μm, inclusive, to 1.0 μm, inclusive.

2. The conversion LED as claimed in claim 1, wherein the mean particle size $d_{50}$ of the phosphor powder is in the vicinity of the particle size with the greatest maximum of the absorption of the primary radiation, and deviates therefrom by at most 50%.

3. The conversion LED as claimed in claim 1, wherein the chip emits blue radiation with a peak emission wavelength of from 430 to 490 nm, which is partially absorbed by the at least one phosphor, which converts this radiation into longer wavelength radiation such that the LED emits white light overall.

4. The conversion LED as claimed in claim 1, wherein the phosphor particles have primary particles with a mean primary particle size in the range of from 0.1 µm, inclusive, to 1.0 µm, inclusive.

5. The conversion LED as claimed in claim 4, wherein the phosphor particles have a spherical or substantially spherical shape.

6. The conversion LED as claimed in claim 4, wherein the phosphor particles comprise essentially only the primary particles.

7. The conversion LED as claimed in claim 4, wherein the primary particles form substantially a single phase.

8. The conversion LED as claimed in claim 4, wherein the primary particles have the structure of a garnet.

9. The conversion LED as claimed in claim 8, wherein the garnet has a composition of $A_3B_5O_{12}$ wherein A is at least one of the elements Y, Gd, La, Tb and B is at least one of the elements Al, Ga, In.

10. The conversion LED as claimed in claim 9, wherein the composition of the garnet is $Y_3Al_5O_{12}$.

11. The conversion LED as claimed in claim 9, wherein the primary particles have at least one doping with a rare earth metal.

12. The conversion LED as claimed in claim 11, wherein the rare earth metal is selected from the group Ce, Gd, La, Tb, Pr, Eu individually or in combination.

13. The conversion LED as claimed in claim 1, wherein the mean pore size is approximately 0.5 µm.

14. The conversion LED as claimed in claim 1, wherein the phosphor particles have pores corresponding to a density in the range of from 40%, inclusive, to 70%, inclusive, of the theoretical density of the phosphor material.

15. The conversion LED as claimed in claim 1, wherein the mean particle size $d_{50}$ of the phosphor powder is in the vicinity of the particle size with the greatest maximum of the absorption of the primary radiation, and deviates therefrom by at most 20%.

* * * * *